(12) United States Patent
Hairapetian

(10) Patent No.: US 6,937,080 B2
(45) Date of Patent: Aug. 30, 2005

(54) CURRENT-CONTROLLED CMOS LOGIC FAMILY

(75) Inventor: Armond Hairapetian, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/142,450

(22) Filed: May 9, 2002

(65) Prior Publication Data

US 2002/0130692 A1 Sep. 19, 2002

Related U.S. Application Data

(62) Division of application No. 09/484,586, filed on Jan. 18, 2000, now Pat. No. 6,424,194.
(60) Provisional application No. 60/141,355, filed on Jun. 28, 1999.

(51) Int. Cl.[7] .............................................. H03K 3/356
(52) U.S. Cl. ....................... 327/210; 327/201; 327/203; 327/333; 327/437; 326/81
(58) Field of Search ................................. 327/199–203, 327/210–215, 219, 223, 228, 229, 230, 333, 391; 326/93–98, 104, 115, 119, 62, 63, 68, 80, 81

(56) References Cited

U.S. PATENT DOCUMENTS

| | | | |
|---|---|---|---|
| 4,333,020 A | 6/1982 | Maeder | |
| 4,395,774 A | 7/1983 | Rapp | |
| 4,449,248 A | 5/1984 | Leslie et al. | 340/9.36 |
| 4,519,068 A | 5/1985 | Krebs et al. | 370/329 |
| 4,545,023 A | 10/1985 | Mizzi | 708/143 |
| 4,599,526 A | * 7/1986 | Paski | 327/214 |
| 4,649,293 A | * 3/1987 | Ducourant | 327/77 |
| 4,680,787 A | 7/1987 | Marry | 455/557 |
| 4,727,309 A | 2/1988 | Vajdic et al. | |
| 4,731,796 A | 3/1988 | Masterton et al. | 395/223 |

(Continued)

FOREIGN PATENT DOCUMENTS

| | | |
|---|---|---|
| EP | 0685933 | 6/1995 |
| JP | 63280517 A | 11/1998 |

OTHER PUBLICATIONS

Buhanan, "CML and Flip TAB Join Forces in the DPS 88's Micropackages," Electronics, (Nov. 3, 1982).

Chu et al.: "A comparison of CMOS circuit techniques: Differential cascode voltage switch logic versus conventional logic" IEEE Journal of Solid–State Circuits, vol. SC–22(4) pp. 528–532, (Aug. 1987).

Gray et al., "Analysis and Design of Analog Integrated Circuits," John Wiley Sons, Inc., pp. 704–709, (1977).

Harrold, "An Introduction to GaAs IC Design," Prentice Hall International, UK Ltd., pp. 43–45, 63, 160, (1993).

Heller et al.: "Cascade voltage switch logic: A differential CMOS logic family", IEEE International Solid–State Circuits Conference, pp. 16–17 (Feb. 22, 1984).

(Continued)

Primary Examiner—Timothy P. Callahan
Assistant Examiner—Hai L. Nguyen
(74) Attorney, Agent, or Firm—Garlick Harrison & Markison LLP; Shayne X. Short

(57) ABSTRACT

Various circuit techniques for implementing ultra high speed circuits use current-controlled CMOS ($C^3MOS$) logic fabricated in conventional CMOS process technology. An entire family of logic elements including inverter/buffers, level shifters, NAND, NOR, XOR gates, latches, flip-flops and the like are implemented using $C^3MOS$ techniques. Optimum balance between power consumption and speed for each circuit application is achieve by combining high speed $C^3MOS$ logic with low power conventional CMOS logic. The combined $C^3MOS$/CMOS logic allows greater integration of circuits such as high speed transceivers used in fiber optic communication systems.

12 Claims, 9 Drawing Sheets

U.S. PATENT DOCUMENTS

| | | | |
|---|---|---|---|
| 4,737,975 A | 4/1988 | Shafer ........................ 455/418 |
| 4,761,822 A | 8/1988 | Maile .......................... 455/82 |
| 4,777,657 A | 10/1988 | Gillaspie .................. 455/186.7 |
| 4,794,649 A | 12/1988 | Fujiwara ....................... 455/9 |
| 4,804,954 A | 2/1989 | Macnak et al. ............. 340/7.34 |
| 4,806,796 A | 2/1989 | Bushey et al. |
| 4,807,282 A | 2/1989 | Kazan et al. ............... 379/284 |
| 4,817,115 A | 3/1989 | Campo et al. ............... 375/238 |
| 4,850,009 A | 7/1989 | Zook et al. .............. 379/93.11 |
| 4,890,832 A | 1/1990 | Zomaki ........................ 463/44 |
| 4,894,792 A | 1/1990 | Mitchell et al. ............. 361/684 |
| 4,916,441 A | 4/1990 | Gombrich ................... 345/769 |
| 4,964,121 A | 10/1990 | Moore ........................ 370/311 |
| 4,969,206 A | 11/1990 | Desrochers .............. 455/575.5 |
| 4,970,406 A | 11/1990 | Fitzpatrick et al. |
| 4,977,611 A | 12/1990 | Maru ...................... 455/161.2 |
| 4,995,099 A | 2/1991 | Davis ......................... 340/735 |
| 5,008,879 A | 4/1991 | Fischer et al. .............. 370/401 |
| 5,025,486 A | 6/1991 | Klughart .................... 340/3.1 |
| 5,029,183 A | 7/1991 | Tymes ........................ 375/141 |
| 5,031,231 A | 7/1991 | Miyazaki .................... 455/574 |
| 5,033,109 A | 7/1991 | Kawano et al. ........... 455/575.9 |
| 5,041,740 A * | 8/1991 | Smith ......................... 327/212 |
| 5,055,659 A | 10/1991 | Hendrick et al. ......... 340/10.51 |
| 5,055,660 A | 10/1991 | Bertagna et al. ....... 235/472.02 |
| 5,079,452 A * | 1/1992 | Lain et al. .................. 327/223 |
| 5,081,402 A | 1/1992 | Koleda ........................ 318/16 |
| 5,087,099 A | 2/1992 | Stolarczyk .................. 299/1.6 |
| 5,115,151 A | 5/1992 | Hull et al. |
| 5,117,501 A | 5/1992 | Childress et al. .......... 455/11.1 |
| 5,119,502 A | 6/1992 | Kallin et al. ................ 455/434 |
| 5,121,408 A | 6/1992 | Cai et al. .................... 375/134 |
| 5,123,029 A | 6/1992 | Bantz et al. ................ 375/133 |
| 5,128,938 A | 7/1992 | Borras ........................ 370/311 |
| 5,134,347 A | 7/1992 | Koleda ........................ 318/16 |
| 5,142,573 A | 8/1992 | Umezawa ................... 379/454 |
| 5,150,361 A | 9/1992 | Wieczorek et al. ......... 370/311 |
| 5,152,006 A | 9/1992 | Klaus ......................... 455/574 |
| 5,153,878 A | 10/1992 | Krebs ......................... 370/337 |
| 5,175,870 A | 12/1992 | Mabey et al. ............. 455/67.11 |
| 5,177,378 A | 1/1993 | Nagasawa |
| 5,179,721 A | 1/1993 | Comroe et al. ............. 455/26.1 |
| 5,181,200 A | 1/1993 | Harrison .................... 370/468 |
| 5,196,805 A | 3/1993 | Beckwith et al. |
| 5,216,295 A | 6/1993 | Hoang |
| 5,230,084 A | 7/1993 | Nguyen ..................... 340/7.34 |
| 5,239,662 A | 8/1993 | Danielson et al. .......... 709/246 |
| 5,241,542 A | 8/1993 | Natarajan et al. ........... 370/311 |
| 5,241,691 A | 8/1993 | Owen ......................... 455/517 |
| 5,247,656 A | 9/1993 | Kabuo et al. |
| 5,249,220 A | 9/1993 | Moskowitz et al. ..... 379/93.19 |
| 5,249,302 A | 9/1993 | Metroka et al. ......... 455/522.1 |
| 5,265,238 A | 11/1993 | Canova, Jr. et al. ............ 713/1 |
| 5,265,270 A | 11/1993 | Stengel et al. ............ 455/343.2 |
| 5,274,666 A | 12/1993 | Dowdell et al. ............. 375/133 |
| 5,276,680 A | 1/1994 | Messenger .................. 370/311 |
| 5,278,831 A | 1/1994 | Mabey et al. ............... 370/349 |
| 5,289,055 A * | 2/1994 | Razavi ........................ 326/126 |
| 5,289,469 A | 2/1994 | Tanaka ....................... 370/469 |
| 5,291,516 A | 3/1994 | Dixon et al. ................ 375/131 |
| 5,293,639 A | 3/1994 | Wilson et al. ................ 455/17 |
| 5,296,849 A | 3/1994 | Ide ............................ 340/7.43 |
| 5,297,144 A | 3/1994 | Gilbert et al. ............... 370/346 |
| 5,301,196 A | 4/1994 | Ewen et al. |
| 5,323,392 A | 6/1994 | Ishii et al. ................... 370/466 |
| 5,331,509 A | 7/1994 | Kikinis ....................... 361/686 |
| 5,345,449 A | 9/1994 | Buckingham et al. |
| 5,349,649 A | 9/1994 | Iijima ......................... 709/228 |
| 5,361,397 A | 11/1994 | Wright ...................... 340/7.36 |
| 5,363,121 A | 11/1994 | Freund ....................... 718/101 |
| 5,373,149 A | 12/1994 | Rasmussen ................. 235/492 |
| 5,373,506 A | 12/1994 | Tayloe et al. ............... 370/311 |
| 5,390,206 A | 2/1995 | Rein et al. ................... 375/170 |
| 5,392,023 A | 2/1995 | D'Avello et al. ........... 358/400 |
| 5,406,615 A | 4/1995 | Miller, II et al. ........ 455/552.1 |
| 5,406,643 A | 4/1995 | Burke et al. ................ 709/243 |
| 5,418,837 A | 5/1995 | Johansson et al. .......... 455/558 |
| 5,420,529 A | 5/1995 | Guay et al. |
| 5,423,002 A | 6/1995 | Hart ........................... 709/249 |
| 5,426,637 A | 6/1995 | Derby et al. ................ 370/401 |
| 5,428,636 A | 6/1995 | Meier ......................... 375/202 |
| 5,430,845 A | 7/1995 | Rimmer et al. ............... 710/12 |
| 5,434,518 A | 7/1995 | Sinh et al. |
| 5,438,329 A | 8/1995 | Gastouniotis et al. .. 340/870.02 |
| 5,440,560 A | 8/1995 | Rypinski .................... 370/457 |
| 5,457,412 A | 10/1995 | Tamba et al. |
| 5,459,412 A | 10/1995 | Mentzer |
| 5,465,081 A | 11/1995 | Todd ......................... 340/18.2 |
| 5,481,265 A | 1/1996 | Russell ........................ 341/22 |
| 5,481,562 A | 1/1996 | Pearson et al. ............. 375/222 |
| 5,510,734 A * | 4/1996 | Sone ........................... 324/65 |
| 5,510,748 A | 4/1996 | Erhart et al. |
| 5,521,530 A | 5/1996 | Yao et al. |
| 5,533,029 A | 7/1996 | Gardner ..................... 370/329 |
| 5,535,373 A | 7/1996 | Olnowich .................... 703/25 |
| 5,544,222 A | 8/1996 | Robinson et al. ........... 455/557 |
| 5,548,230 A | 8/1996 | Gerson et al. |
| 5,576,644 A * | 11/1996 | Pelella ......................... 327/51 |
| 5,579,487 A | 11/1996 | Meyerson et al. .......... 710/100 |
| 5,583,456 A * | 12/1996 | Kimura ...................... 326/115 |
| 5,584,048 A | 12/1996 | Wieczorek ................. 340/7.33 |
| 5,600,267 A | 2/1997 | Wong et al. |
| 5,606,268 A | 2/1997 | Van Brunt |
| 5,625,308 A * | 4/1997 | Matsumoto et al. ........ 327/203 |
| 5,628,055 A | 5/1997 | Stein ........................ 455/575.1 |
| 5,630,061 A | 5/1997 | Richter et al. ......... 395/200.02 |
| 5,640,356 A | 6/1997 | Gibbs |
| 5,675,584 A | 10/1997 | Jeong |
| 5,680,633 A | 10/1997 | Koenck et al. ......... 235/472.02 |
| 5,724,361 A | 3/1998 | Fiedler |
| 5,732,346 A | 3/1998 | Lazaridis et al. ........... 455/406 |
| 5,740,366 A | 4/1998 | Mahany et al. ............. 709/227 |
| 5,744,366 A | 4/1998 | Kricka et al. ................. 436/63 |
| 5,767,699 A | 6/1998 | Bosnyak et al. |
| 5,796,727 A | 8/1998 | Harrison et al. ............ 370/338 |
| 5,798,658 A * | 8/1998 | Werking ....................... 326/17 |
| 5,821,809 A | 10/1998 | Boerstler et al. |
| 5,839,051 A | 11/1998 | Grimmett et al. ........... 455/551 |
| 5,844,437 A * | 12/1998 | Asazawa et al. ............ 327/202 |
| 5,877,642 A | 3/1999 | Takahashi |
| 5,892,382 A | 4/1999 | Ueda et al. |
| 5,903,176 A | 5/1999 | Westgate |
| 5,905,386 A | 5/1999 | Gerson |
| 5,940,771 A | 8/1999 | Gollnick et al. ............ 455/517 |
| 5,945,847 A | 8/1999 | Ransijn |
| 5,945,858 A | 8/1999 | Sato |
| 5,945,863 A | 8/1999 | Coy |
| 5,969,556 A * | 10/1999 | Hayakawa .................. 327/202 |
| 6,002,279 A | 12/1999 | Evans et al. |
| 6,014,041 A | 1/2000 | Somasekhar et al. |
| 6,014,705 A | 1/2000 | Koenck et al. ............. 109/230 |
| 6,025,746 A * | 2/2000 | So .............................. 327/325 |
| 6,028,454 A | 2/2000 | Elmasry et al. |
| 6,037,841 A | 3/2000 | Tanji et al. |
| 6,037,842 A | 3/2000 | Bryan et al. |
| 6,038,254 A | 3/2000 | Ferraiolo et al. |
| 6,061,747 A | 5/2000 | Ducaroir et al. |
| 6,081,162 A | 6/2000 | Johnson |
| 6,094,074 A | 7/2000 | Chi et al. |
| 6,104,214 A | 8/2000 | Ueda et al. |
| 6,114,843 A | 9/2000 | Olah |

| | | | |
|---|---|---|---|
| 6,188,339 B1 | | 2/2001 | Hasegawa |
| 6,194,950 B1 | | 2/2001 | Kibar et al. |
| 6,218,878 B1 | * | 4/2001 | Ueno .................. 327/202 |
| 6,222,380 B1 | | 4/2001 | Gerowitz et al. |
| 6,232,844 B1 | | 5/2001 | Talaga, Jr. |
| 6,259,312 B1 | | 7/2001 | Murtojärvi |
| 6,265,898 B1 | | 7/2001 | Bellaouar |
| 6,310,501 B1 | * | 10/2001 | Yamashita ............. 327/215 |
| 6,363,011 B1 | * | 3/2002 | Hirose et al. .......... 365/185.07 |
| 6,374,311 B1 | | 4/2002 | Mahany et al. .......... 710/18 |
| 6,424,194 B1 | * | 7/2002 | Hairapetian ............ 327/210 |
| 6,463,092 B1 | | 10/2002 | Kim et al. |
| 6,538,486 B1 | * | 3/2003 | Chen et al. ............ 327/202 |

OTHER PUBLICATIONS

Hodges et al., "Analysis and Design of Digital Integrated Circuits," McGraw Hill, Inc., pp. 271–283, (1983).

Katsu et al., "A GaAs Monolithic Frequency Divider Using Source Coupled FET Logic," IEEE Electron Device Letters, vol. EDL–3, No. 8, (Aug./1982).

Katsu et al., "A Source Coupled FET Logic—A New Current–Mode Approach to GaAs Logics," IEEE Transactions on Electron Devices, vol. ED–32, No. 6, (Jun. 1985).

Lee, T. "The Design of CMOS Radio–Frequency Integrated Circuits," 1998, Cambridge Press, New York, N.Y., pp. 178–185.

Pfennings et al.: "Differential split–level CMOS logic for subnanosecond speeds", IEEE Journal of Solid–State Circuits, vol. SC–20(5), pp. 1050–1055, (Oct. 1985).

Rudell, J. et al., "A 1.9–GHz Wide–Band IF Double Conversion CMOS Receiver for Cordless Telephone Applications" IEEE Journal of Solid State Circuits, vol. 32(12) , pp. 2071–2088, Dec. 1997.

Somasekhar and Kaushik, "Differential current switch logic a power DCVS logic family" IEEE Journal of Solid–State Circuits, vol. 31(7), pp. 981–991, (Jul. 1996).

Yamashina and Yamada, "An MOS current mode logic (MCML) Circuit for low–power Sub–GHz Processors" IEICE Trans. Electron., vol. E75–C(10) pp. 1181–1187, (Oct. 1992).

Yamashina and Yamada, "An MOS current mode logic (MCML) Circuit for low–power Sub–GHz Processors" NEC Res. Develop., vol. 36(1), pp. 54–63, (Jan. 1995).

Mizuno, et al., "A GHz MOS Adaptive Pipeline Technique Using Mos Current–Mode Logic," *IEEE Journal of Solid–State Circuits*, vol. 31, No. 6, pp. 784–791, (Jun. 1996).

Yamashina, et al., "A Low–Supply Voltage GHz MOS Integrated Circuit for Mobile Computing Systems," *IEEE Symposium on Low Power Electronics*, pp. 80–81, (1994).

Atkinson, A Single Chip Radio Transceiver for DECT, IEEE 1997.

Mizuno, A GHzMOS Adaptive Pipeline Technique Using MOS Curren–Mode Logic, IEEE Journal of Solid–State Circuits, vol. 31, No. 6, pp 784–791 (Jun. 1996).

Klose, Process–Optimization for Sub–3Ops BiCMOS Technologies for Mixed ECL/CMOS Applications, IEEE 1991.

Heimsch, Merged CMOS/Bipolar Current Switch Logic (MCSL), IEEE Journal of Solid–State Circuits, vol. 24, No. 5, pp. 1307–1311 (Oct. 1989).

Elrabaa, Optimization of Digital BiCMOS Circuit, An Overview, IEEE 1992.

Elrabaa, Multimitter BiCMOS CML Circuits, IEEE Journal of Solid– State Circuits, vol. 27, No. 3, PP. 454–458 (Mar. 1992).

Ewen et al., Single–Chip 1062Mbaud CMOS Transceiver for Serial Data Communication, 1995 IEEE International Solid–State Circuits Conference Digest of Technical Papers, pp. 32–33, 336.

Chen and Waldron, A Single–Chip 266Mb/s CMOS Transmitter/Receiver for Serial Data Communications, 1993 IEEE International Solid–State Circuits Conference Digest of Technical Papers, pp 100–101, 269.

Oshima et al., A Single CMOS SDH Terminal Chip for 622 Mb/s STM 4C, 1994 IEEE International Solid–State Circuits Conference Digest of Technical Papers, pp. 174–175.

Widmer et al., Single–Chip 4x500Mbaud CMOS Transceiver, 1996 IEEE International Solid–State Circuits Conference Digest of Technical Papers, pp. 126–127, 430.

Lee et al., A CMOS Serial Link for 1 Gbaud Fully Duplexed Data Communication, 1994 Symposium on VLSI Circuits Digest of Technical Papers, pp. 125–126.

Lee et al., A CMOS Serial Link for Fully Duplexed Data Communication, IEEE Journal of Solid–State Circuits, vol. 30, pp. 353–364 (Apr. 1995).

Djahanshahi et al., High–speed ECL–Compatible Serial I/O In 0.35μm CMOS, IEEE 1998.

Fukaishi et al., A 4.25–Gb/s CMOS Fiber Channel Transceiver with Asynchronous Tree–Type Demultiplexer and Frequency Conversion Architecture, IEEE Journal of Solid–state Circuits, vol. 33 No. 12, pp. 2139–2147 (1998).

Madhavan and Levi, Low–Power 2.5 Gbit/s VCSEL driver in 0.5μm CMOS technology, Electronics Letters, vol. 34 No. 2 pp. 178–179 (Jan. 1998).

Chen and Baker, A 1.25Gb/s, 460mW CMOS Transceiver for Serial Data Communication, 1997 IEEE International Solid–state Circuits Conference pp. 242–243, 465.

Runge and Thomas, 5Gbit/s 2:1 multiplexer fabricated in 0.35μm CMOS and 3Gbit/s 1:2 demultiplexer fabricated in 0.5μm CMOS technology, Electronics Letters, vol. 35 No. 19.pp. 163 1–33 (Sep. 1999).

Fiedler et al., A 1.0625Gbps Transceiver with 2x–Oversampling and Transmit Signal Pre–Emphasis, 1997 IEEE International Solid– state Circuits Conference pp. 238–239, 464.

Widmer et al., Single–Chip 4x500–MEd CMOS Transceiver, IEEE Journal of Solid–state Circuits, vol. 31 No. 12 pp. 2004–2014 (1996).

Kurisu et al., 2.8Gb/s 176mW Byte–Interleaved and 3.0 Gb/s 118mW Bit–Interleaved 8:1 Multiplexers, 1996 International Solid State Circuits Conference pp. 122–123, 429.

Friedman et al, A Baseband Processor for IS–54 Cellular Telephony, IEEE Journal of Solid–state Circuits, vol. 31 No. 5 pp. 646–655 (May 1996).

Ewen et al., CMOS circuits for Gb/s serial data communication, IBM J. Res. Develop., vol. 39 No. 12 pp. 73–81 (Mar. 1995).

Thompson et al., A 300–MHz BiCMOS Serial Data Transceiver, IEEE Journal of Solid–state Circuits, vol. 29 No. 3 pp. 185–192 (1994).

Yuen et al., An ECL Gate Array with 2.5 GHz Embedded PLL, IEEE 1993.

Quigley et al., Current Mode Transceiver Logic, (CMTL) for Reduced Swing CMOS, Chip to Chip Communication, IEEE 1993.

Dunlop et al., A 9 Gbit/s Bandwidth MultiplexerfDemultiplexer CMOS Chip, 1992 Symposium on VLSI Circuits Digest of Technical Papers pp. 68–69.

Navarro and Van Noije, Design of an 8:1 MUX at 1.7Gbit/s in 0.8μm CMOS Technology, 1998 Great Lakes Symposium on VLSI.

Pederson and Metz, A CMOS to 100K ECL Interface Circuit, 1989 IEEE International Solid–state Circuits Conference pp. 226–227, 345.

Baumert et al., A Monolithic 50–200 MHz CMOS Clock Recovery and Retiming Circuit, IEEE 1989 Custom Integrated Circuits Conference pp. 14.5.1–14.5.4. (May 1989).

Bida, A Hybrid Wireless MAC Protocol Supporting Asynchronous and Synchronous MSDU Delivery Services, IEEE 802.11/91–92, Sep. 1991, pp. 1–46.

Robert Meier's Master's Thesis, Mobile Computer Network Architecture, (May 1993), 82 pages.

Hoberecht, A Layered network Protocol for Packet Voice and Data Integration, IEEE Journal on Selected Areas in Communications, vol. SAC–1, No. 6 (Dec. 1983). pp. 1006–1013.

Rypinski, Architecture–Topology and Protocol Stacks, IEEE 802.11/91–21, Mar. 1991, 12 pages.

Cheah, A Proposed Architecture and Access Protocol Outline for the IEEE 802.11 Radio LAN Standards, Document IEEE P802.11/91–54, May 1991; pages 1–20.

Rypinski, Power–Drain Considerations for Full Time and Sleep Mode Radio Receivers, IEEE P802.11/91–99, Sep. 1991, 11 pages.

Natarajan et al, Battery Efficient Operation of Radio MAC Protocol, IEEE P802.11/91–102, Sep. 1991, pp. 1–5.

Cox, A Radio System Proposal for Widespread Low–Power Tetherless Communications, IEEE Transactions on Communications, vol. 39, No. 2 (Feb. 1991), pp. 324–335.

Bagby, One Approach to Wireless Network Architecture, IEEE P802.11/91–2, Jan. 1991, 1–15, 17–21.

Biba, A Modest Proposal for a Asynchronous, Data Intensive, Wireless Local Area Network, IEEE P802.11/91–25, Mar. 1991; pp. 1–25.

Heimschi et al; Merged CMOS/Bipolar Current Switch Logic (MCSL), IEEE Journal of Solid State Circuits, vol. 24, pp. 1307–1311, Oct. 1989, p. 1307–1311.

Elrabaa et al; Optimization of Digital BiCMOS Circuits, An Overview, IEEE 1992, 5 pages.

Mudd et al, Very High Speed ECL/CMG Gate Arrays with Submicron Structures; IEEE 1989, 5 pages.

* cited by examiner

CURRENT-CONTROLLED CMOS LOGIC FAMILY

BACKGROUND OF THE INVENTION

The present invention relates in general to integrated circuitry, and in particular to a complementary metal-oxide-semiconductor (CMOS) logic family with enhanced speed characteristics.

For a number of reasons CMOS is the logic family of choice in today's VLSI devices. Due to the complementary nature of its operation, CMOS logic consumes zero static power. CMOS also readily scales with technology. These two features are highly desirable given the drastic growth in demand for low power and portable electronic devices. Further, with the computer aided design (CAD) industry's focus on developing automated design tools for CMOS based technologies, the cost and the development time of CMOS VLSI devices has reduced significantly.

The one drawback of the CMOS logic family, however, remains its limited speed. That is, conventional CMOS logic has not achieved the highest attainable switching speeds made possible by modem sub-micron CMOS technologies. This is due to a number of reasons. Referring to FIG. 1, there is shown a conventional CMOS inverter 100—the most basic building block of CMOS logic. A p-channel transistor 102 switches between the output and the positive power supply Vcc, and an n-channel transistor 104 switches between the output and the negative power supply (or ground). The switching speed in CMOS logic is inversely proportional to the average on resistance (Ron) of the MOS transistor, and the load capacitance $C_L$ on a given node ($\tau = R_{on} \times C_L$). The on resistance Ron is proportional to the transistor channel length L divided by the power supply voltage (i.e., Ron $\alpha$ L/Vcc), while the load capacitance is given by the gate capacitance of the transistor being driven (i.e., W×L×Cox, where Cox is the gate oxide capacitance), plus the interconnect parasitic capacitance $C_{int}$. Therefore, with reduced transistor channel lengths L, the switching speed is generally increased. However, this relationship no longer holds in sub-micron technologies. As the channel length L in CMOS technology shrinks into the sub-micron range, the power supply voltage must be reduced to prevent potential damage to the transistors caused by effects such as oxide breakdown and hot-electrons. The reduction of the power supply voltage prevents the proportional lowering of Ron with the channel length L. Moreover, the load capacitance which in the past was dominated by the capacitances associated with the MOS device, is dominated by the routing or interconnect capacitance ($C_{int}$) in modern sub 0.5 micron technologies. This means that the load capacitance will not be reduced in proportion with the channel length L. Thus, the RC loading which is the main source of delaying the circuit remains relatively the same as CMOS technology moves in the sub-micron range.

As a result of the speed limitations of conventional CMOS logic, integrated circuit applications in the Giga Hertz frequency range have had to look to alternative technologies such as ultra high speed bipolar circuits and Gallium Arsenide (GaAs). These alternative technologies, however, have drawbacks of their own that have made them more of a specialized field with limited applications as compared to silicon MOSFET that has had widespread use and support by the industry. In particular, compound semiconductors such as GaAs are more susceptible to defects that degrade device performance, and suffer from increased gate leakage current and reduced noise margins. Furthermore, attempts to reliably fabricate a high quality oxide layer using GaAs have not thus far met with success. This has made it difficult to fabricate GaAs FETs, limiting the GaAs technology to junction field-effect transistors (JFETs) or Schottky barrier metal semiconductor field-effect transistors (MESFETs). A major drawback of the bipolar technology, among others, is its higher current dissipation even for circuits that operate at lower frequencies.

It is therefore highly desirable to develop integrated circuit design techniques that are based on conventional silicon CMOS technology, but overcome the speed limitations of CMOS logic.

SUMMARY OF THE INVENTION

The present invention provides a new family of CMOS logic that is based on current-controlled mechanism to maximize speed of operation. The current-controlled CMOS (or C³MOS™) logic family according to the present invention includes all the building blocks of any other logic family. The basic building block of the C³MOS logic family uses a pair of conventional MOSFETs that steer current between a pair of load devices in response to a difference between a pair of input signals. Thus, unlike conventional CMOS logic, C³MOS logic according to this invention dissipates static current, but operates at much higher speeds. In one embodiment, the present invention combines C³MOS logic with CMOS logic within the same integrated circuitry, where C³MOS is utilized in high speed sections and CMOS is used in the lower speed parts of the circuit.

Accordingly, in one embodiment, the present invention provides a current-controlled metal-oxide-semiconductor field-effect transistor (MOSFET) circuit fabricated on a silicon substrate, including a clocked latch made up of first and second n-channel MOSFETs having their source terminals connected together, their gate terminals coupled to receive a pair of differential logic signals, respectively, and their drain terminals connected to a true output and a complementary output, respectively; a first clocked n-channel MOSFET having a drain terminal connected to the source terminals of the first and second n-channel MOSFETs, a gate terminal coupled to receive a first clock signal CK, and a source terminal; third and fourth n-channel MOSFETs having their source terminals connected together, their gate terminals and drain terminals respectively cross-coupled to the true output and the complementary output; a second clocked n-channel MOSFET having a drain terminal connected to the source terminals of the third and fourth n-channel MOSFETs, a gate terminal coupled to receive a second clock signal CKB, and a source terminal; first and second resistive elements respectively coupling the true output and the complementary output to a high logic level; and a current-source n-channel MOSFET connected between the source terminals of the first and second clocked n-channel MOSFETs and a logic low level.

In another embodiment, the circuit further includes a buffer/inverter made up of first and second n-channel MOSFETs having their source terminals connected together, their gate terminals respectively coupled to receive a pair of differential logic signals, and their drain terminals coupled to a high logic level via a respective pair of resistive loads; and a current-source n-channel MOSFET connected between the source terminals of the first and second n-channel MOSFETs and a low logic level, wherein, the drain terminal of the first n-channel MOSFET provides a true output of the buffer/inverter and the drain terminal of the second n-channel MOSFET provides the complementary output of the buffer/inverter.

In yet another embodiment, the present invention provides complementary metal-oxide-semiconductor (CMOS) logic circuitry that combines on the same silicon substrate, current-controlled MOSFET circuitry of the type described above for high speed signal processing, with conventional CMOS logic that does not dissipate static current. Examples of such combined circuitry include serializer/deserializer circuitry used in high speed serial links, high speed phase-locked loop dividers, and the like.

The following detailed description with the accompanying drawings provide a better understanding of the nature and advantages of the current-controlled CMOS logic according to the present invention.

DESCRIPTION OF THE SPECIFIC EMBODIMENTS

The present invention provides ultra high-speed logic circuitry implemented in silicon complementary metal-oxide-semiconductor (CMOS) process technology. A distinction is made herein between the terminology "CMOS process technology" and "CMOS logic." CMOS process technology as used herein refers generally to a variety of well established CMOS fabrication processes that form a field-effect transistor over a silicon substrate with a gate terminal typically made of polysilicon material disposed on top of an insulating material such as silicon dioxide. CMOS logic, on the other hand, refers to the use of complementary CMOS transistors (n-channel and p-channel) to form various logic gates and more complex logic circuitry, wherein zero static current is dissipated. The present invention uses current-controlled mechanisms to develop a family of very fast current-controlled CMOS (or $C^3MOS$™) logic that can be fabricated using a variety of conventional CMOS process technologies, but that unlike conventional CMOS logic does dissipate static current. $C^3MOS$ logic or current-controlled metal-oxide-semiconductor field-effect transistor (MOSFET) logic are used herein interchangeably.

Figure 2:
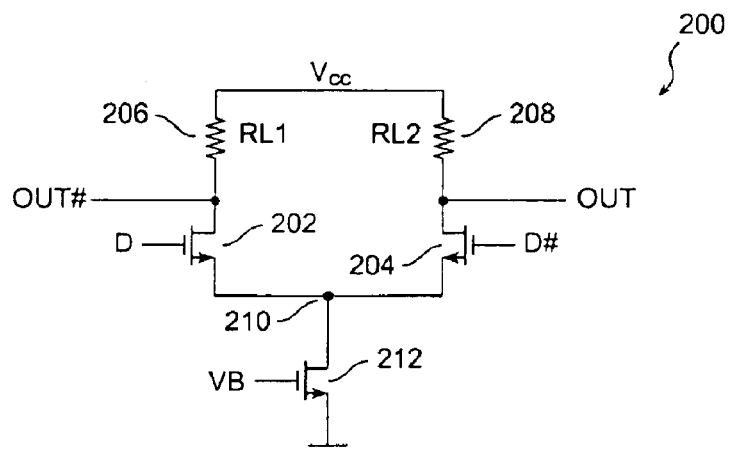
FIG. 2 is an inverter/buffer implemented in $C^3MOS$ according to an exemplary embodiment of the present invention.

In a preferred embodiment, the basic building block of this logic family is an NMOS differential pair with resistive loads. Referring to FIG. 2, there is shown one embodiment for the basic $C^3MOS$ inverter/buffer 200 according to the present invention. Inverter/buffer 200 includes a pair of n-channel MOSFETs 202 and 204 that receive differential logic signals D and D# at their gate terminals, respectively. Resistive loads 206 and 208 connect the drain terminals of MOSFETs 202 and 204, respectively, to the power supply Vcc. Drain terminals of MOSFETs 202 and 204 form the outputs OUT# and OUT of the inverter/buffer, respectively. Resistive loads 206 and 208 may be made up of either p-channel MOSFETs operating in their linear region, or resistors made up of, for example, polysilicon material. In a preferred embodiment, polysilicon resistors are used to implement resistive loads 206 and 208, which maximizes the speed of inverter/buffer 200. The source terminals of n-channel MOSFETs 202 and 204 connect together at node 210. A current-source n-channel MOSFET 212 connects node 210 to ground (or negative power supply). A bias voltage VB drives the gate terminal of current-source MOSFET 212 and sets up the amount of current I that flows through inverter/buffer 200. In response to the differential signal at D and D#, one of the two input n-channel MOSFETs 202 and 204 switches on while the other switches off. All of current I, thus flows in one leg of the differential pair pulling the drain terminal (OUT or OUT#) of the on transistor down to logic low, while the drain of the other (off) transistor is pulled up by its resistive load toward logic high. At the OUT output this circuit is a buffer, while at the OUT# output the circuit acts as an inverter.

Figure 1:
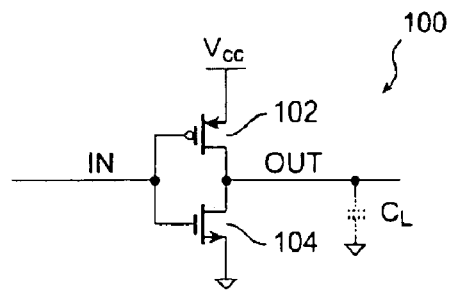
FIG. 1 shows a conventional CMOS inverter.

Significant speed advantages are obtained by this type of current steering logic. Unlike the conventional CMOS inverter of FIG. 1, when either one of the input MOSFETs 202 or 204 is switching on, there is no p-channel pull-up transistor that fights the n-channel. Further, circuit 200 requires a relatively small differential signal to switch its transistors. This circuit also exhibits improved noise performance as compared to the CMOS inverter of FIG. 1, since in the $C^3MOS$ inverter/buffer, transistors do not switch between the power supply and the substrate. Logic circuitry based on current-steering techniques have been known in other technologies such as bipolar, where it is called emitter-coupled logic (ECL), and GaAs where it is called source-coupled FET logic (SCFL). This technique, however, has not been seen in silicon CMOS technology for a number of reasons, among which is the fact that CMOS logic has always been viewed as one that dissipates zero static current.

The C³MOS logic as proposed by the present invention, on the other hand, does dissipate static current.

The design of each C³MOS logic cell according to the present invention is optimized based on several considerations including speed, current dissipation, and voltage swing. The speed of the logic gate is determined by the resistive load and the capacitance being driven. As discussed above, the preferred embodiment according to the present invention uses polysilicon resistors to implement the load devices. P-channel MOSFETs can alternatively be used, however, they require special biasing to ensure they remain in linear region. Further, the junction capacitances of the p-channel load MOSFETs introduce undesirable parasitics. Speed requirements place a maximum limit on the value of the resistive loads. On the other hand, the various C³MOS logic cells are designed to preferably maintain a constant voltage swing (I×R). Accordingly, the values for R and I are adjusted based on the capacitive load being driven to strike the optimum trade-off between switching speed and power consumption.

Figure 3:
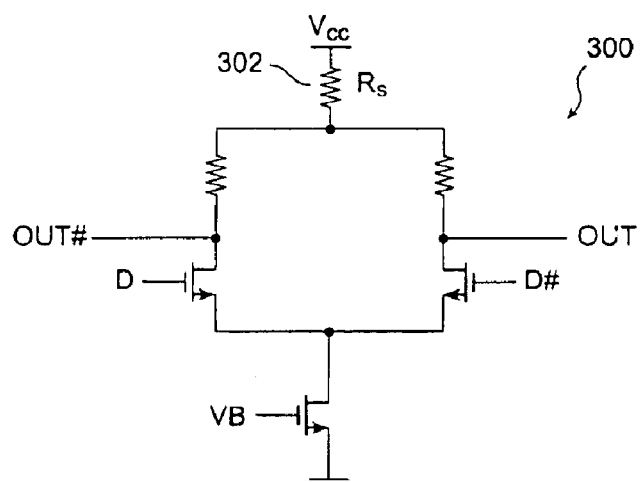
FIG. 3 shows an exemplary $C^3MOS$ level shift buffer according to the present invention.

The C³MOS logic family, according to the present invention, contains all the building blocks of other logic families. Examples of such building blocks include inverters, buffers, level shift buffers, N-input NOR and NAND gates, exclusive OR (XOR) gates, flip flops and latches, and the like. FIG. 3 shows an exemplary C³MOS level shift circuit 300 according to the present invention. Level shift circuit 300 includes essentially the same circuit elements as inverter/buffer 200 shown in FIG. 2, with an additional resistor Rs 302 inserted between the power supply Vcc and the load resistors. Circuit 300 operates in the same fashion as inverter/buffer 200 except that it has its power supply voltage shifted by a value equal to (I×Rs). The C³MOS logic circuitry according to the present invention employs this type of level shifter to make the necessary adjustments in the signal level depending on the circuit requirements. Examples of C³MOS circuits utilizing this type of level shifting will be described below in connection with other types of C³MOS logic elements.

Figure 4A:
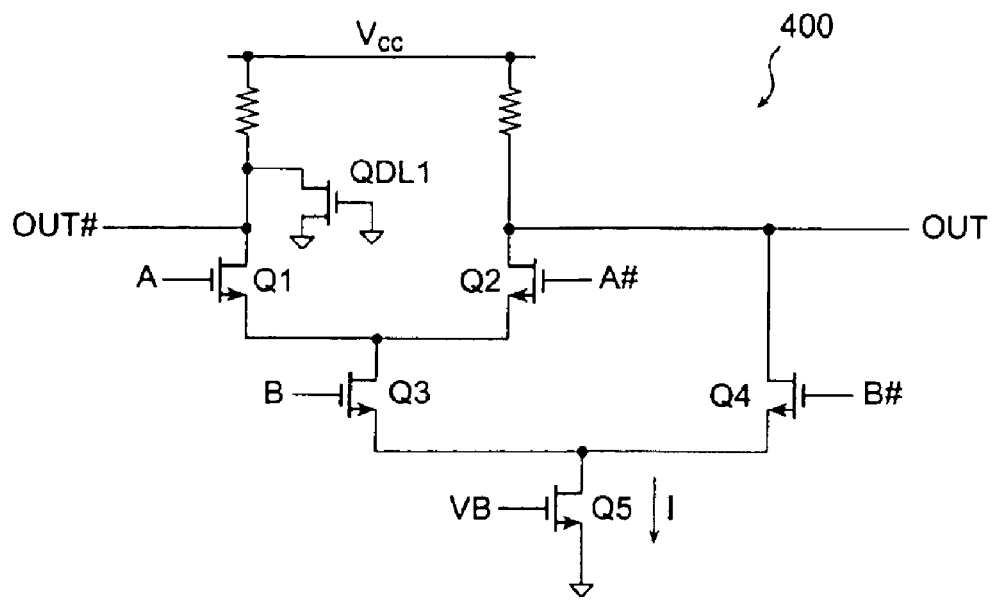
FIGS. 4A and 4B show exemplary $C^3MOS$ implementations for an AND/NAND gate and an OR/NOR gate, respectively.
Figure 4B:
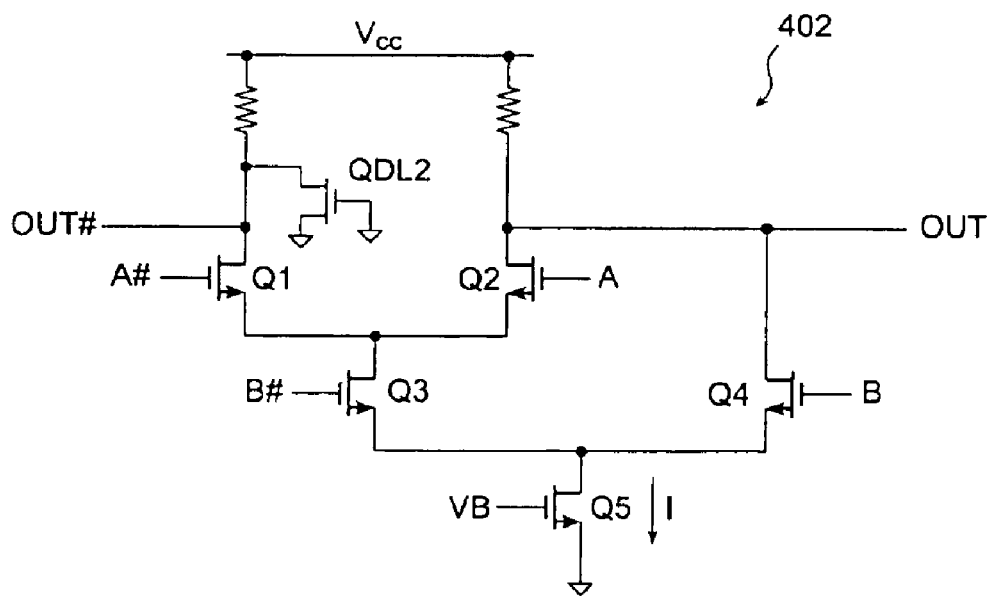

FIGS. 4A and 4B show exemplary C³MOS implementations for an exemplary 2-input AND/NAND gate 400 and an exemplary 2-input OR/NOR gate 402, respectively. These gates operate based on the same current steering principal as discussed above. A logic low signal at input B of AND/NAND gate 400 brings OUT to ground via Q4 while OUT# is pulled high by its load resistor. A logic low at the A input also pulls OUT to ground via Q2 and Q3 (B=high). OUT is pulled high only when both A and B are high disconnecting any path to ground. OUT# provides the inverse of OUT. OR/NOR gate 402 operates similarly to generate OR/NOR logic at its outputs. When another set of transistors are inserted in each leg of the differential pair as is the case for gates 400 and 402, the signals driving the inserted transistors (Q3, Q4) need level shifting to ensure proper switching operation of the circuit. Thus, high speed C³MOS level shifters such as those presented in FIG. 3 can be employed to drive signals B and B#. In a preferred embodiment, since node OUT in both gates 400 and 402 must drive the additional parasitics associated transistors Q4, dummy load transistors DQL1 and DQL2 connect to node OUT# to match the loading conditions at both outputs.

Figure 5:
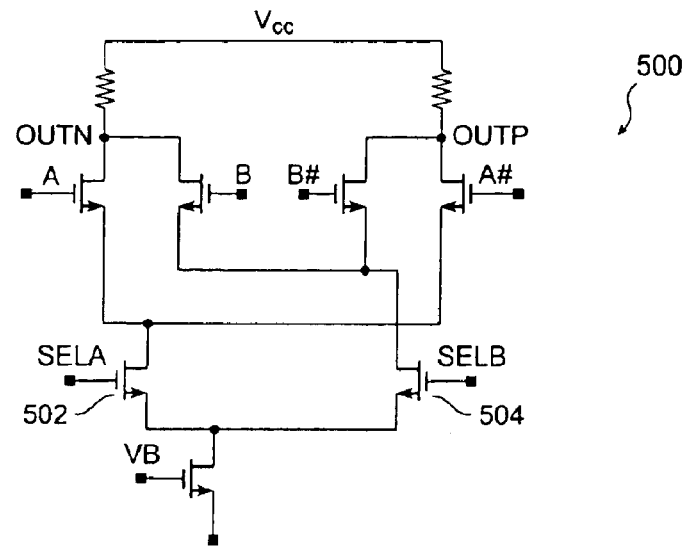
FIG. 5 shows an exemplary $C^3MOS$ implementation for a 2:1 multiplexer.

FIG. 5 shows an exemplary C³MOS implementation for a 2:1 multiplexer 500. Similar to the other C³MOS logic gates, multiplexer 500 includes a differential pair for each input, but multiplexer 500 further includes select transistors 502 and 504 inserted between the common source terminals of the differential pairs and the current source transistor in a cascode structure. By asserting one of the select input signals SELA or SELB, the bias current is steered to the differential pair associated with that select transistor. Thus, signal SELA steers the bias current to the differential pair with A and A# inputs, and signal SELB steers the bias current to the differential pair with B and B# inputs. Similar to gates 400 and 402, the signals SELA and SELB driving inserted transistors 502 and 504 need level shifting to ensure proper switching operation of the circuit.

Figure 6:
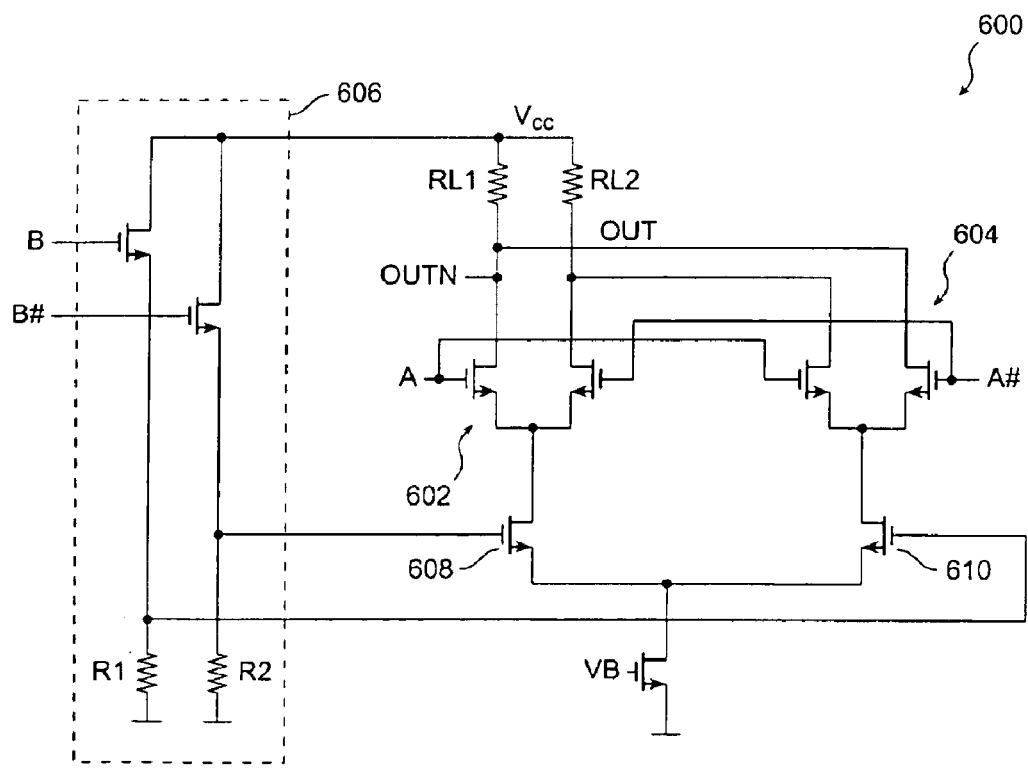
FIG. 6 shows an exemplary $C^3MOS$ implementation for a two-input exclusive OR/NOR gate.

FIG. 6 shows an exemplary C³MOS implementation for a two-input exclusive OR (XOR) gate 600. This implementation includes two differential pairs 602 and 606 that share the same resistive load, receive differential signals A and A# at their inputs as shown, and have their drain terminals cross-coupled at the outputs. The other differential input signals B and B# are first level shifted by circuit 606 and then applied to cascode transistors 608 and 610 that are inserted between the differential pairs and the current source transistor. The circuit as thus constructed performs the XOR function on the two input signals A and B.

Figure 7:
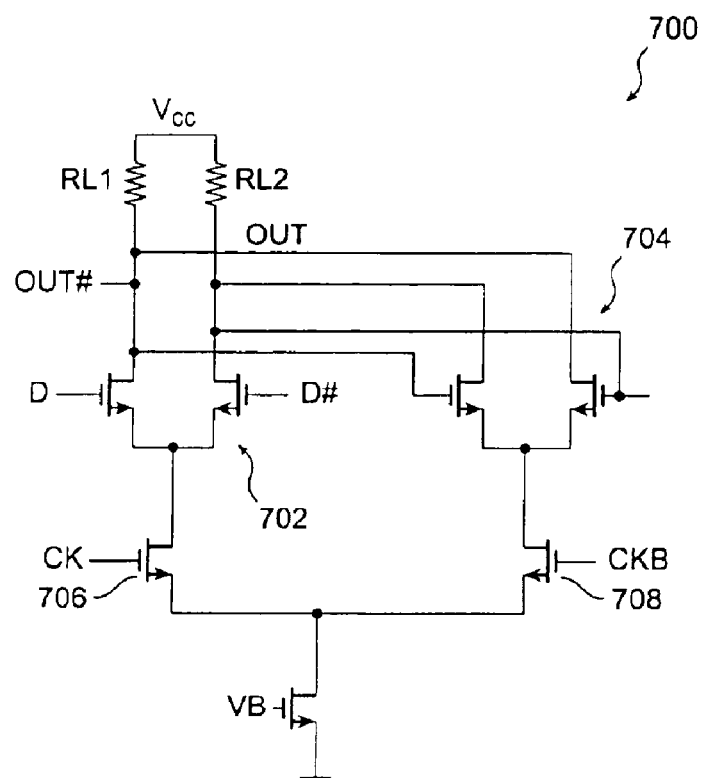
FIG. 7 is a circuit schematic showing an exemplary $C^3MOS$ clocked latch according to the present invention.

FIG. 7 is a circuit schematic showing an exemplary C³MOS clocked latch 700 according to the present invention. Latch 700 includes a first differential pair 702 that receives differential inputs D and D# at the gate terminals, and a second differential pair 704 that has its gate and drain terminals cross-coupled to the outputs of OUT and OUT# first differential pair 702. Clocked transistors 706 and 708 respectively connect common-source nodes of differential pairs 702 and 704 to the current-source transistor. Complementary clock signals CK and CKB drive the gate terminals of clocked transistors 706 and 708. Similar to the other C³MOS gates that have additional transistors inserted between the differential pair and the current-source transistor, clock signals CK and CKB are level shifted by level shift circuits such as that of FIG. 3.

Figure 8:
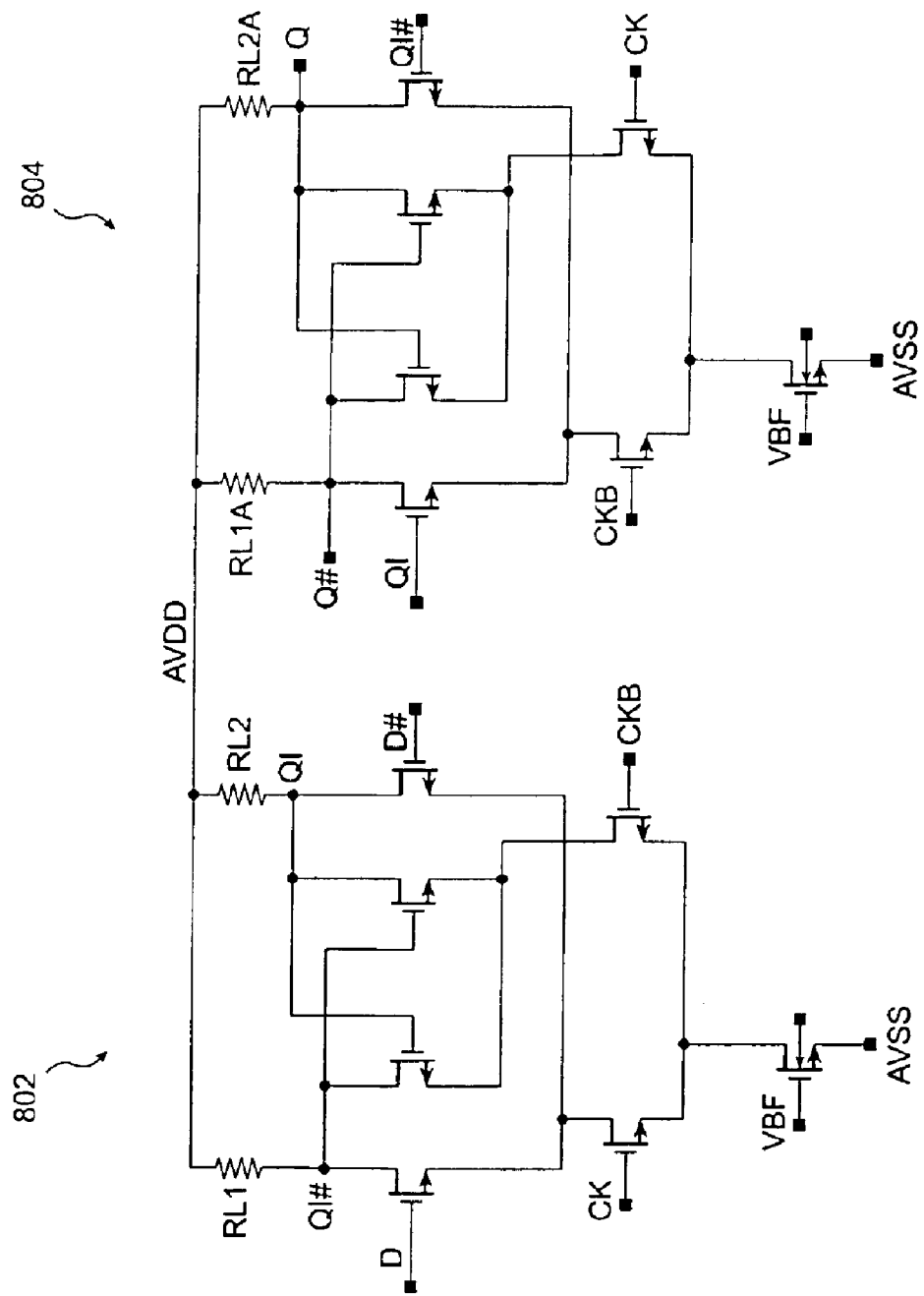
FIG. 8 is a circuit schematic for a $C^3MOS$ flip-flop using the $C^3MOS$ latch of FIG. 7 according to an embodiment of the present invention.

A C³MOS master-slave flip-flop 800 according to the present invention can be made by combining two latches 700 as shown in FIG. 8. A first latch 802 receives differential input signals D and D# and generates differential output signals QI and QI#. The differential output signals QI and QI# are then applied to the differential inputs of a second latch 804. The differential outputs Q and Q# of second latch 804 provide the outputs of flip-flop 800.

Figure 9:
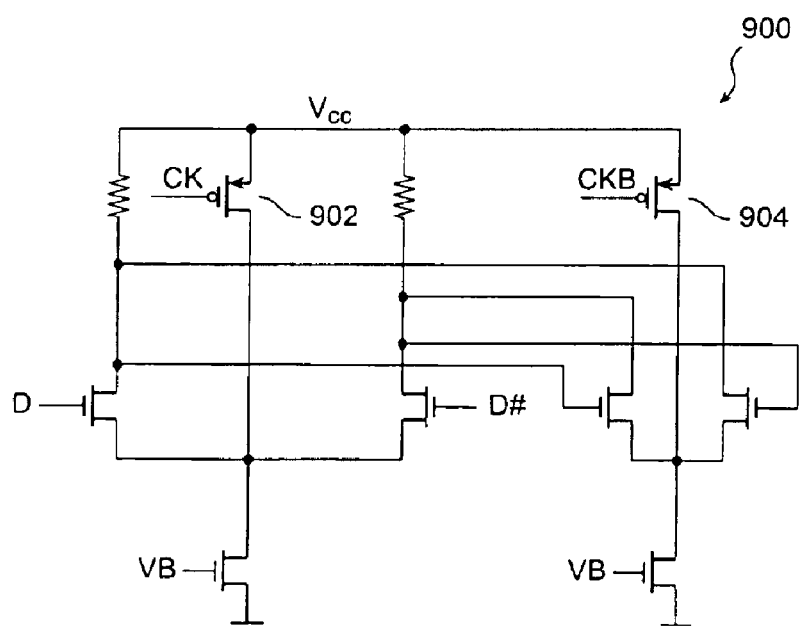
FIG. 9 shows one example of an alternative implementation for a $C^3MOS$ clocked latch that uses p-channel transistors.

Every one of the logic gates described thus far may be implemented using p-channel transistors. The use of p-channel transistors provides for various alternative embodiments for C³MOS logic gates. FIG. 9 shows one example of an alternative implementation for a C³MOS clocked latch 900 that uses p-channel transistors. In this embodiment, instead of inserting the n-channel clocked transistors between the common-source nodes of the differential pairs and the current-source transistor, p-channel clocked transistors 902 and 904 connect between the common-source nodes and the power supply Vcc. This implementation also requires that each differential pair have a separate current-source transistor as shown. Clocked latch 900 operates essentially the same as latch 700 shown in FIG. 7, except the implementation is not as efficient both in terms of size and speed.

Figure 10:
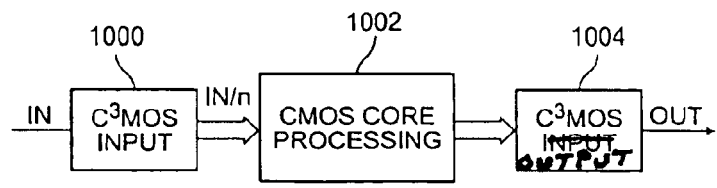
FIG. 10 shows a block diagram for a circuit that combines $C^3MOS$ and conventional CMOS logic on a single silicon substrate to achieve optimum tradeoff between speed and power consumption.

As illustrated by the various C³MOS logic elements described above, all of the building blocks of any logic circuitry can be constructed using the C³MOS technique of the present invention. More complex logic circuits such as shift registers, counters, frequency dividers, etc., can be constructed in C³MOS using the basic elements described above. As mentioned above, however, C³MOS logic does consume static power. The static current dissipation of C³MOS may become a limiting factor in certain large scale circuit applications. In one embodiment, the present invention combines C³MOS logic with conventional CMOS logic to achieve an optimum balance between speed and power consumption. According to this embodiment of the present invention, an integrated circuit utilizes C³MOS logic for the ultra high speed (e.g., GHz) portions of the circuitry, and conventional CMOS logic for the relatively lower speed sections. For example, to enable an integrated circuit to be used in ultra high speed applications, the input and output circuitry that interfaces with and processes the high speed signals is implemented using C³MOS. The circuit also employs C³MOS to divide down the frequency of the signals being processed to a low enough frequency where conventional CMOS logic can be used. The core of the circuit, according to this embodiment, is therefore implemented by conventional CMOS logic that consumes zero static current. FIG. 10 shows a simplified block diagram illustrating this exemplary embodiment of the invention. A C³MOS input circuit 1000 receives a high frequency input signal IN and outputs a divided down version of the signal IN/n. The lower frequency signal IN/n is then processes by core circuitry 1002 that is implemented in conventional CMOS logic. A C³MOS output circuit 1004 then converts the processed IN/n signal back to the original frequency (or any other desired frequency) before driving it onto the output node OUT.

Figure 11:
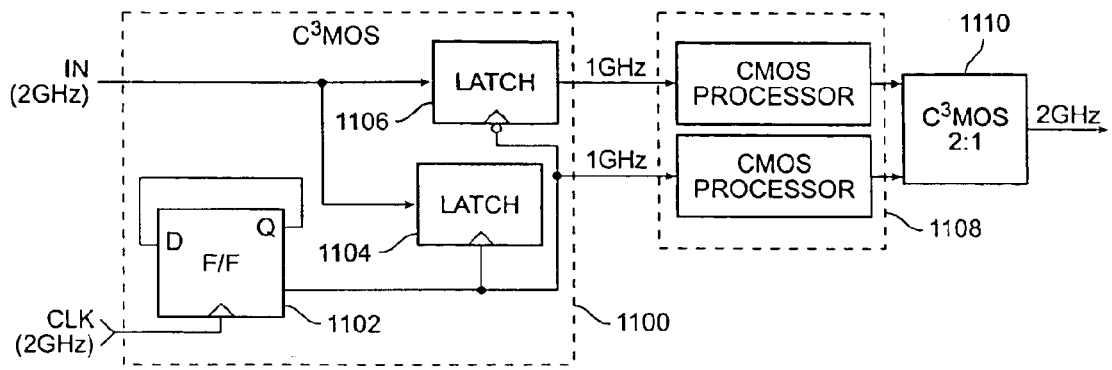
FIG. 11 shows an exemplary circuit application of the $C^3MOS/CMOS$ combined logic wherein $C^3MOS$ logic is used to deserialize and serialize the signal stream while CMOS logic is used as the core signal processing logic circuitry.

An example of a circuit implemented using combined CMOS/C³MOS logic according to the present invention is shown in FIG. 11. C³MOS input circuitry 1100 is a deserializer that receives a serial bit stream at a high frequency of, for example, 2 GHz. A 2 GHz input clock signal CLK is divided down to 1 GHz using a C³MOS flip-flop 1102, such as the one shown in FIG. 8, that is connected in a ÷2 feedback configuration. The 1 GHz output of flip-flop 1102 is then supplied to clock inputs of a pair of C³MOS latches 1104 and 1106. Latches 1104 and 1106, which may be of the type shown in FIG. 6, receive the 2 GHz input bit stream at their inputs and respectively sample the rising and falling edges of the input bit stream in response to the 1 GHz clock signal CLK/2. The signal CLK/2 which is applied to the B/B# inputs of each latch (the level shifted input; see FIG. 6), samples the input data preferably at its center. It is to be noted that the rise and fall times of the signal in CMOS logic is often very dependent on process variations and device matching. C³MOS logic, on the other hand, is different in nature and therefore provides much improved margins for sampling.

Referring back to FIG. 11, block 11 thus deserializes the input bit stream with its frequency halved to allow for the use of conventional CMOS logic to process the signals. The signals at the outputs of latches 1104 and 1106 are applied to parallel processing circuitry 1108 that are implemented in conventional CMOS logic operating at 1 GHz. The reverse is performed at the output where a serializer 1110 receives the output signals from processing circuitry 1108 and serializes them using C³MOS logic. The final output signal is a bit stream with the original 2 GHz frequency. Circuit applications wherein this technique can be advantageously be employed include high speed single or multi-channel serial links in communication systems.

As apparent from the circuit shown in FIG. 11, this technique doubles the amount of the core signal processing circuitry. However, since this part of the circuit is implemented in conventional CMOS logic, current dissipation is not increased by the doubling of the circuitry. Those skilled in the art appreciate that there can be more than one level of deserializing if further reduction in operating frequency is desired. That is, the frequency of the input signal can be divided down further by 4 or 8 or more if desired. As each resulting bit stream will require its own signal processing circuitry, the amount and size of the overall circuitry increases in direct proportion to the number by which the input signal frequency is divided. For each application, therefore, there is an optimum number depending on the speed, power and area requirements.

Figure 12:
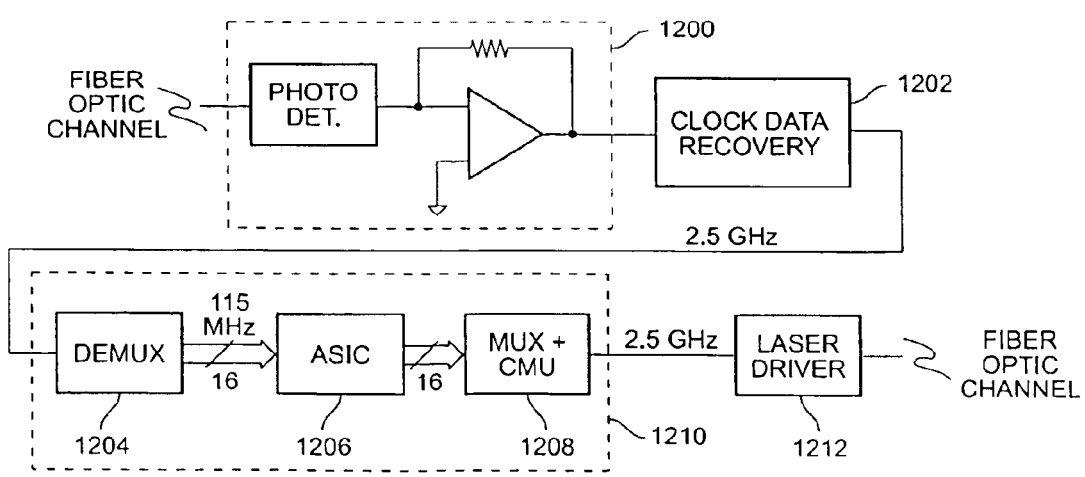
FIG. 12 is a simplified block diagram of a transceiver system that utilizes the $C^3MOS/CMOS$ combined logic according to the present invention to facilitate interconnecting high speed fiber optic communication channels.

According to one embodiment of the present invention the combined C³MOS/CMOS circuit technique as shown in FIG. 11 is employed in a transceiver of the type illustrated in FIG. 12. The exemplary transceiver of FIG. 12 is typically found along fiber optic channels in high speed telecommunication networks. The transceiver includes at its input a photo detect and driver circuit 1200 that receives the input signal from the fiber optic channel. Circuit 1200 converts fiber-optic signal to packets of data and supplies it to a clock data recovery (CDR) circuit 1202. CDR circuit 1202 recovers the clock and data signals that may be in the frequency range of about 2.5 GHz, or higher. Established telecommunication standards require the transceiver to perform various functions, including data monitoring and error correction. These functions are performed at a lower frequency. Thus, the transceiver uses a demultiplexer 1204 which deserializes the 2.5 GHz data stream into, for example, 16 parallel signals having a frequency of about 155 MHz. An application specific integrated circuit (ASIC) 1206 then performs the monitoring and error correction functions at the lower (155 MHz) frequency. A multiplexer and clock multiplication unit (CMU) 1208 converts the parallel signals back into a single bit stream at 2.5 GHz. This signal is then retransmitted back onto the fiber optic channel by a laser drive 1212. The combined C³MOS/CMOS technique of the present invention allows fabrication of demultiplexer 1204, ASIC 1206 and multiplexer and CMU 1208 on a single silicon die in a similar fashion as described in connection with the circuit of FIGS. 10 and 11. That is, demultiplexer 1204 and multiplexer and CMU 1208 are implemented in C³MOS with ASIC 1206 implemented in conventional CMOS.

Figure 13:
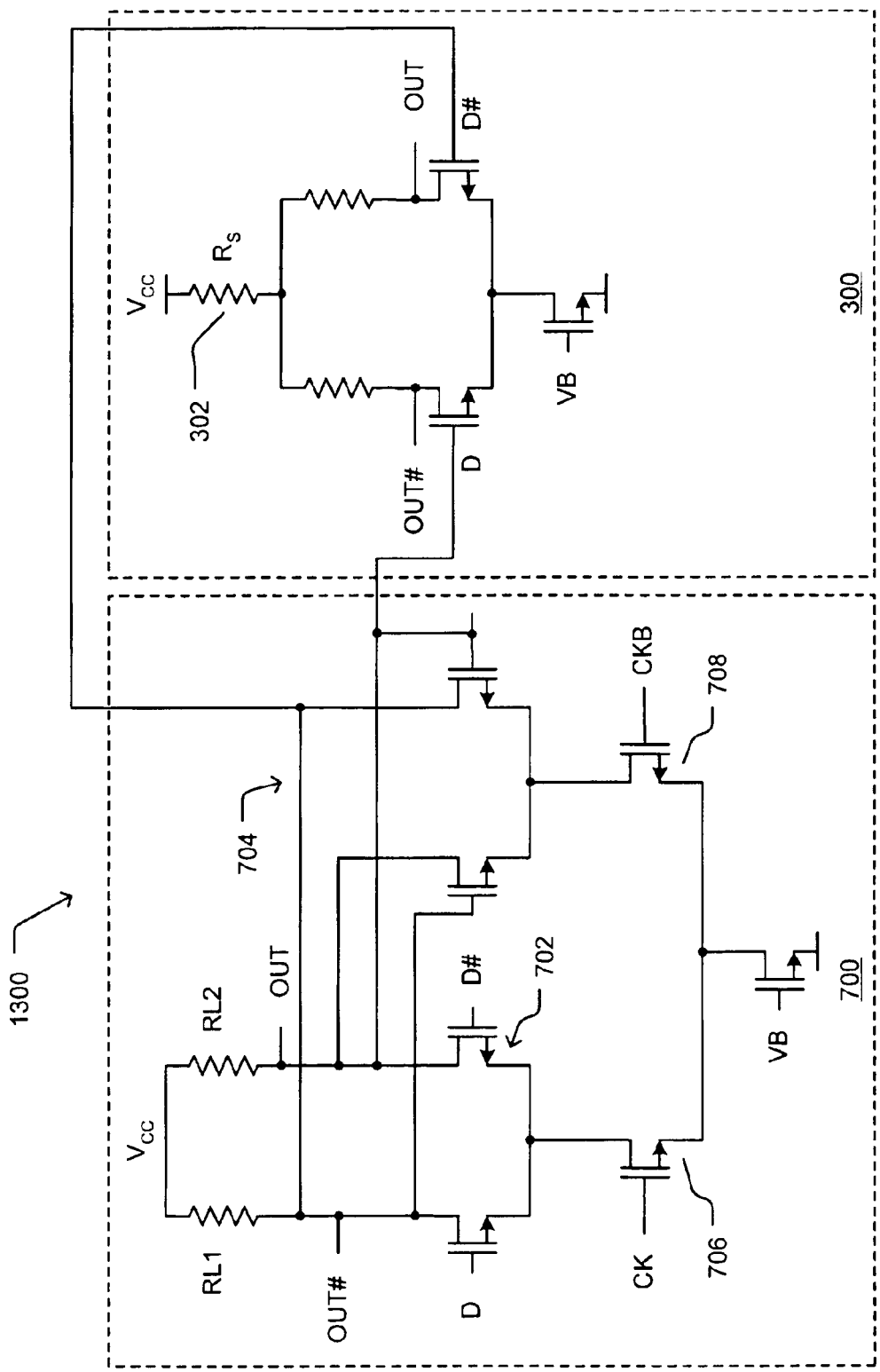
FIG. 13 shows one possible embodiment by which a $C^3MOS$ clocked latch may be communicatively coupled to a $C^3MOS$ level shift buffer in accordance with certain aspects of the inventions.

FIG. 13 shows one possible embodiment by which a C³MOS clocked latch may be communicatively coupled to a C³MOS level shift buffer in accordance with certain aspects of the invention. This diagram shows how the exemplary C³MOS clocked latch 700 may be communicatively coupled to the exemplary C³MOS level shift circuit 300. The differential outputs, OUT and OUT#, of exemplary C³MOS clocked latch 700 are communicatively coupled to the differential outputs, D and D#, of the exemplary C³ MOS level shift circuit 300. This embodiment shows a more complex circuit that includes the combination of two of the C³MOS building blocks disclosed herein.

Figure 14:
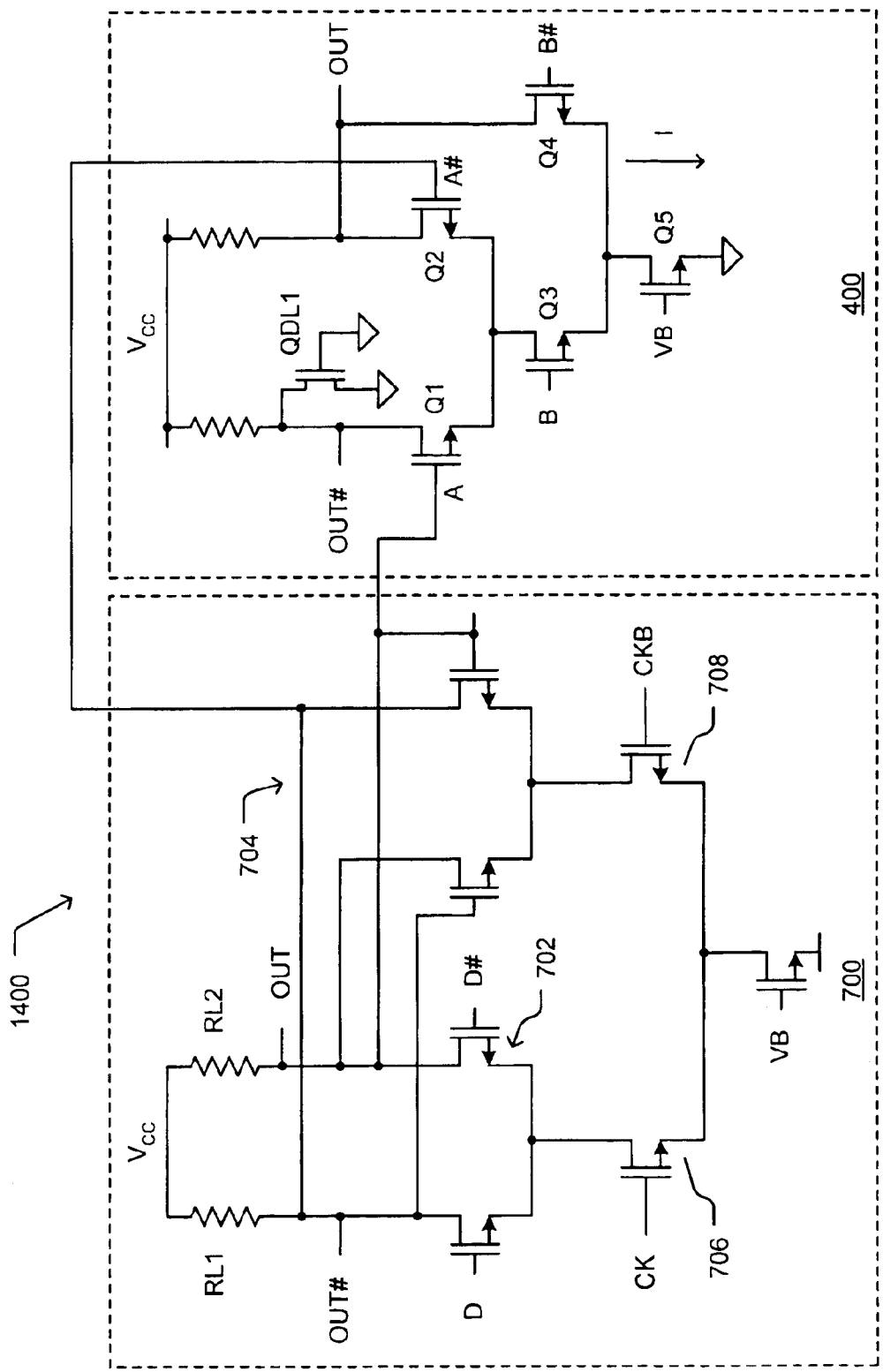
FIG. 14 shows one possible embodiment by which a $C^3MOS$ clocked latch may be communicatively coupled to a $C^3MOS$ implementation for an AND/NAND gate in accordance with certain aspects of the invention.

FIG. 14 shows one possible embodiment by which a C³MOS clocked latch may be communicatively coupled to a C³MOS implementation for an AND/NAND gate in accordance with certain aspects of the invention. This diagram shows how the exemplary C³MOS clocked latch 700 may be communicatively coupled to the C³MOS implementation for the 2-input AND/Nand gate 400. The differential outputs, OUT and OUT#, of the exemplary C³MOS clocked latch 700 are communicatively coupled to the differential outputs, A and A#, of the C³MOS implementation for the 2-input AND/NAND gate 400. This embodiment shows another more complex circuit that includes the combination of two of the C³MOS building blocks disclosed herein. Specifically, this diagram shows one possible embodiment of a clocked latch being communicatively coupled to one type of a logic gate.

Figure 15:
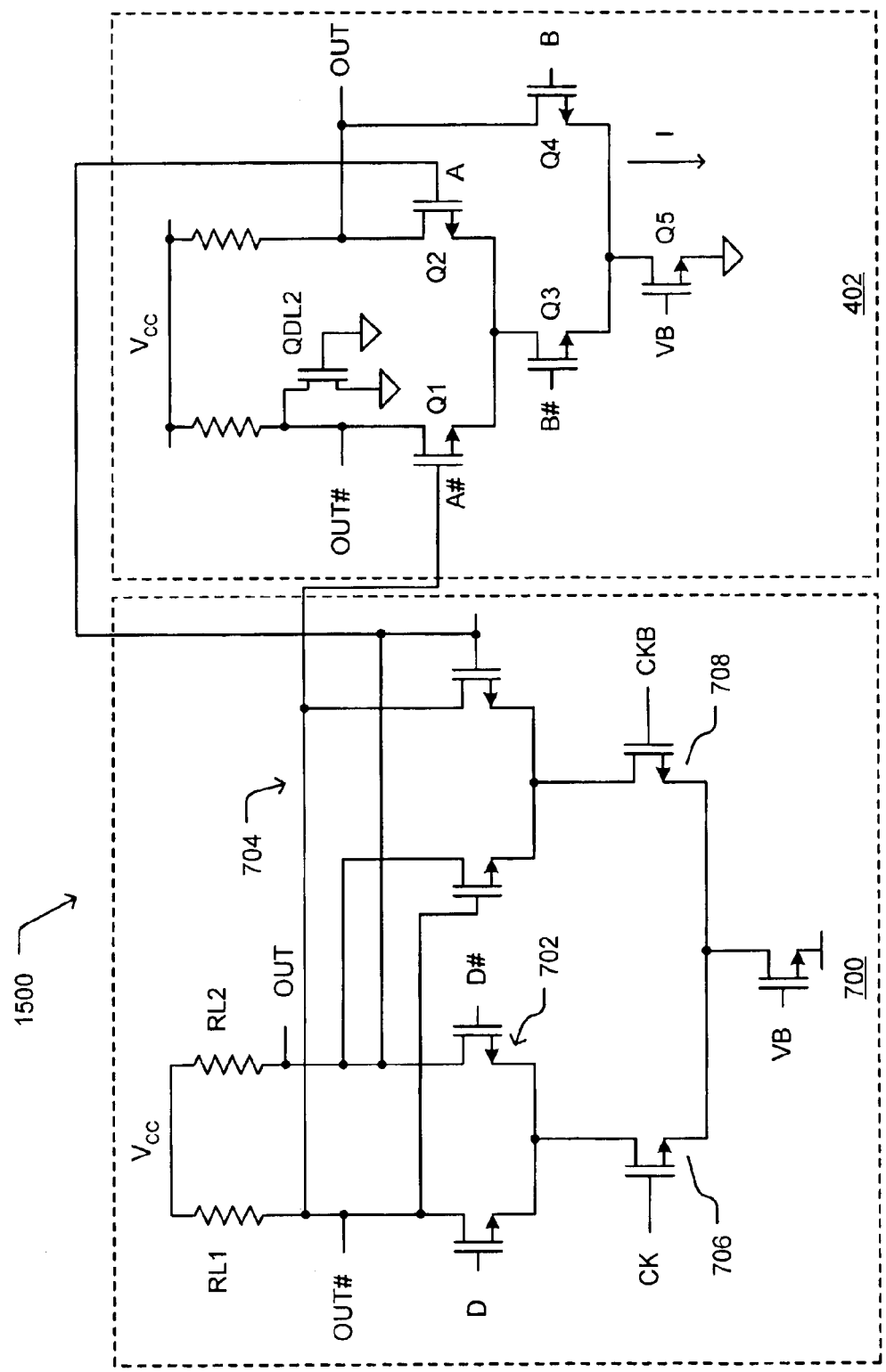
FIG. 15 shows one possible embodiment by which a $C^3MOS$ clocked latch may be communicatively coupled to a $C^3MOS$ implementation for an OR/NOR gate in accordance with certain aspects of the invention.

FIG. 15 shows one possible embodiment by which a C³MOS clocked latch may be communicatively coupled to a C³mos implementation for an OR/NOR gate in accordance with certain aspects of the invention. This diagram shows how the exemplary C³MOS clocked latch 700 may be communicatively coupled to the C³MOS implementation for the 2-input OR/NOR gate 402. The differential outputs, OUT and OUT#, of the exemplary C³MOS clocked latch 700 are communicatively coupled to the differential outputs, A and A#, of the C³MOS implementation for the 2-input OR/NOR gate 402. This embodiment shows another more complex circuit that includes the combination of two of the C³MOS building blocks disclosed herein. Specifically, this diagram shows one possible embodiment of a clocked latch being communicatively coupled to yet another type of a logic gate.

Each of these diagrams (FIG. 13, FIG. 14, and FIG. 15) show possible embodiments by which more complex circuits may be designed using some of the various C³MOS building blocks disclosed herein. Clearly, other possible combinations of these C³MOS bulding blocks may also be connected and communicatively coupled without departing from the scope and spirit of the invention.

In conclusion, the present invention provides various circuit techniques for implementing ultra high speed circuits using current-controlled CMOS (C³MOS) logic fabricated in conventional CMOS process technology. An entire family of logic elements including inverter/buffers, level shifters, NAND, NOR, XOR gates, latches, flip-flops and the like have been developed using C³MOS according to the present invention. In one embodiment, the present invention advantageously combines high speed C³MOS logic with low power conventional CMOS logic. According to this embodiment circuits such as transceivers along fiber optic channels can be fabricated on a single chip where the ultra-high speed portions of the circuit utilize C³MOS and the relatively lower speed parts of the circuit use conventional CMOS logic. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A current-controlled metal-oxide-semiconductor field-effect transistor (MOSFET) circuit fabricated on a silicon substrate, comprising:

a clocked latch including:
first and second n-channel MOSFETs having their source terminals connected together, their gate terminals coupled to receive a first pair of differential logic signals, respectively, and their drain terminals connected to a true output and a complementary output, respectively;
a first clocked n-channel MOSFET having a drain terminal coupled to the source terminals of the first and second n-channel MOSFETs, a gate terminal coupled to receive a first clock signal CK, and a source terminal;
third and fourth n-channel MOSFETs having their source terminals coupled together, their gate terminals and drain terminals respectively cross-coupled to the true output and the complementary output;
a second clocked n-channel MOSFET having a drain terminal coupled to the source terminals of the third and fourth n-channel MOSFETs, a gate terminal coupled to receive a second clock signal CKB, and a source terminal;
first and second resistive elements respectively coupling the true output and the complementary output to a logic high level; and
a first current-source n-channel MOSFET coupled between the source terminals of the first and second clocked n-channel MOSFETs and a logic low level; and a level shifter coupled to the first clocked latch, the level shifter including:
fifth and sixth n-channel MOSFETs having their source terminals coupled together, their gate terminals respectively coupled to receive a second pair of differential logic signals being the true output and the complementary output of the first clocked latch, and their drain terminals coupled to a common node via a respective pair of resistive loads;
a level shift resistive element coupled between the common node and the logic high level; and
a second current-source n-channel MOSFET coupled between the source terminals of the fifth and sixth n-channel MOSFETs and the logic low level,
wherein, the drain terminal of the fifth n-channel MOSFET provides a true output of the level shifter and the drain terminal of the sixth n-channel MOSFET provides the complementary output of the level shifter.

2. The circuit of claim 1 wherein the first and second resistive elements are constructed from substantially polysilicon material.

3. The circuit of claim 1 further comprising:
a buffer/inverter coupled to the level shifter and including:
seventh and eighth n-channel MOSFETs having their source terminals coupled together, their gate terminals respectively coupled to receive a third pair of differential logic signals being the true output and the complementary output of the level shifter, and their drain terminals coupled to the logic high level via at least one additional respective pair of resistive loads; and
a third current-source n-channel MOSFET coupled between the source terminals of the seventh and eighth n-channel MOSFETs and a logic low level,
wherein, the drain terminal of the seventh n-channel MOSFET provides a true output of the buffer/inverter and the drain terminal of the eighth n-channel MOSFET provides the complementary output of the buffer/inverter.

4. The circuit of claim 1 further comprising a second clocked latch similarly constructed as the first clocked latch and coupled to the level shifter, wherein gate terminals of the first and second n-channel MOSFETs in the second clocked latch respectively couple to the true output and the complementary output of the level shifter.

5. The circuit of claim 1 further comprising a logic gate coupled to the level shifter, the logic gate including:
seventh and eighth n-channel MOSFETs having their source terminals coupled to a first node, their gate terminals coupled to receive a third pair of differential logic signals being the true output and the complementary output of the level shifter, respectively, and their drain terminals connected to a true output and a complementary output of the logic gate, respectively;

ninth and tenth n-channel MOSFETs having their source terminals coupled to a second node, their gate terminals coupled to receive a fourth pair of differential logic signals, respectively, and their drain terminals coupled to the first node and one of either the true output or the complementary output, respectively;

third and fourth resistive elements respectively coupling the true output and the complementary output of the logic gate to the logic high level; and a third current-source n-channel MOSFET coupled between the second node and a logic low level, wherein, the logic gate implements one of AND/NAND gate or OR/NOR gate depending on logic polarity of the third pair of differential logic signals applied to the gate terminals of the seventh and eighth n-channel MOSFETs and logic polarity of the fourth pair of differential logic signals applied to the gate terminals of the ninth and tenth n-channel MOSFETs, respectively.

6. The circuit of claim 5 wherein the first, second, third and fourth resistive elements are constructed from substantially polysilicon material.

7. The circuit of claim 5 wherein the logic gate further comprises a dummy load MOSFET having a first source/drain terminal coupled to the true output or complementary output of the logic gate, and a second source/drain terminal and gate terminal coupled to a reference signal.

8. The circuit of claim 7 wherein the reference signal is the logic low level.

9. A current-controlled metal-oxide-semiconductor field-effect transistor (MOSFET) circuit fabricated on a silicon substrate, comprising:

a first clocked latch including:

first and second n-channel MOSFETs having their source terminals connected together, their gate terminals coupled to receive a first pair of differential logic signals, respectively, and their drain terminals connected to a true output and a complementary output, respectively;

a first clocked n-channel MOSFET having a drain terminal coupled to the source terminals of the first and second n-channel MOSFETs, a gate terminal coupled to receive a first clock signal CK, and a source terminal;

third and fourth n-channel MOSFETs having their source terminals coupled together, their gate terminals and drain terminals respectively cross-coupled to the true output and the complementary output;

a second clocked n-channel MOSFET having a drain terminal coupled to the source terminals of the third and fourth n-channel MOSFETs, a gate terminal coupled to receive a second clock signal CKB, and a source terminal;

first and second resistive elements respectively coupling the true output and the complementary output to a logic high level; and a first current-source n-channel MOSFET coupled between the source terminals of the first and second clocked n-channel MOSFETs and a logic low level; and a logic gate coupled to the first clocked latch, the logic gate including:

a fifth and sixth n-channel MOSFETs having their source terminals coupled to a first node, their gate terminals coupled to receive a third pair of differential logic signals being the true output and the complementary output of the first clocked latch, respectively, and their drain terminals connected to a true output and a complementary output of the logic gate; respectively;

seventh and eighth n-channel MOSFETs having their source terminals coupled to a second node, their gate terminals coupled to receive a second pair of differential logic signals, respectively, and their drain terminals coupled to the first node and one of the either the true output or the complementary output of the logic gate, respectively;

third and fourth resistive elements respectively coupling the true output and the complementary output of the logic gate to a logic high level; and a second current-source n-channel MOSFET coupled between the second node and the logic low level, wherein, the logic gate implements one of AND/NAND gate or OR/NOR gate depending on logic polarity of the second pair of differential logic signals applied to the gate terminals of the seventh and eighth n-channel MOSFETs and logic polarity of the third pair of differential logic signals applied to the gate terminals of the fifth and sixth n-channel MOSFETs, respectively.

10. The circuit of claim 9 wherein the first, second, third and fourth resistive elements are constructed from substantially polysilicon material.

11. A current-controlled metal-oxide-semiconductor field-effect transistor (MOSFET) circuit fabricated on a silicon substrate, comprising:

a clocked latch including:

a first and second n-channel MOSFETs having their source terminals connected to a first node, their gate terminals coupled to receive a pair of differential logic signals, respectively, and their drain terminals connected to a true output and a complementary output, respectively;

a first clocked p-channel MOSFET having a drain terminal coupled to the first node, a gate terminal coupled to receive a first clock signal CK, and a source terminal coupled to a logic high level;

a first current source device coupled between the first node and a logic low level;

third and fourth n-channel MOSFETs having their source terminals coupled to a second node, their gate terminals and drain terminals respectively cross-coupled to the true output and the complementary output;

a second clocked p-channel MOSFET having a drain terminal coupled to the second node, a gate terminal coupled to receive a second clock signal CKB, and a source terminal coupled to the logic high level;

a second current source device coupled between the second node and the logic low level; and first and second resistive elements respectively coupling the true output and the complementary output to the logic high level.

12. The circuit of claim 11 wherein the first and second resistive elements are constructed from substantially polysilicon material.

* * * * *

UNITED STATES PATENT AND TRADEMARK OFFICE
CERTIFICATE OF CORRECTION

PATENT NO. : 6,937,080 B2  
APPLICATION NO. : 10/142450  
DATED : August 30, 2005  
INVENTOR(S) : Armond Hairapetian Page 1 of 1

It is certified that error appears in the above-identified patent and that said Letters Patent is hereby corrected as shown below:

Column 9, line 52, in Claim 1: before "clocked" insert --first--

Signed and Sealed this

Nineteenth Day of August, 2008

JON W. DUDAS  
*Director of the United States Patent and Trademark Office*